United States Patent
Shing et al.

(10) Patent No.: US 10,879,882 B1
(45) Date of Patent: Dec. 29, 2020

(54) LOW-POWER FAST-SETTING DELAY CIRCUIT

(71) Applicant: QUALCOMM Incorporated, San Diego, CA (US)

(72) Inventors: George Shing, San Diego, CA (US); Michael Fertsch, Oceanside, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/656,269

(22) Filed: Oct. 17, 2019

(51) Int. Cl.
*H03K 5/133* (2014.01)
*H03K 5/135* (2006.01)
*H04B 1/16* (2006.01)
*H03K 5/00* (2006.01)

(52) U.S. Cl.
CPC .............. *H03K 5/133* (2013.01); *H03K 5/135* (2013.01); *H04B 1/16* (2013.01); *H03K 2005/00078* (2013.01); *H03K 2005/00247* (2013.01)

(58) Field of Classification Search
CPC .................. H03K 5/133; H03K 5/135; H03K 2005/00078; H03K 2005/00247; H04B 1/16
See application file for complete search history.

(56) References Cited

U.S. PATENT DOCUMENTS

| | | | | |
|---|---|---|---|---|
| 6,928,128 | B1* | 8/2005 | Sidiropoulos | H03K 5/133 327/157 |
| 7,728,677 | B2* | 6/2010 | Logan | H03L 7/0995 331/16 |
| 2004/0061545 | A1* | 4/2004 | Iorga | H03K 5/133 327/408 |

* cited by examiner

*Primary Examiner* — John W Poos
(74) *Attorney, Agent, or Firm* — Loza & Loza, LLP/Qualcomm

(57) ABSTRACT

In certain aspects, a delay circuit includes a delay line including a bias input. The delay circuit also includes a bias generator including a clock input, and a bias output, wherein the bias output of the bias generator is coupled to the bias input of the delay line. The delay circuit further includes a multiplexer including a first input, a second input, and an output, wherein the first input of the multiplexer is configured to receive a first clock signal, the second input of the multiplexer is configured to receive a second clock signal, and the output of the multiplexer is coupled to the clock input of the bias generator.

21 Claims, 13 Drawing Sheets

LOW-POWER FAST-SETTING DELAY CIRCUIT

BACKGROUND

Field

Aspects of the present disclosure relate generally to delay circuits, and more particularly, to fast-setting delay circuits.

Background

A delay circuit is a circuit configured to delay a signal by a time delay. Delay circuits may be used to adjust the timing of a signal by delaying the signal by a certain time delay. For example, a delay circuit may be used to adjust the timing of a signal (e.g., a data signal or a clock signal) in a physical layer (PHY) receiver or transmitter. In another example, a delay circuit may be used to adjust the timing of a signal in sequential logic in order to meet setup and hold times of latches in the sequential logic.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a delay circuit. The delay circuit includes a delay line including a bias input. The delay circuit also includes a bias generator including a clock input, and a bias output, wherein the bias output of the bias generator is coupled to the bias input of the delay line. The delay circuit further includes a multiplexer including a first input, a second input, and an output, wherein the first input of the multiplexer is configured to receive a first clock signal, the second input of the multiplexer is configured to receive a second clock signal, and the output of the multiplexer is coupled to the clock input of the bias generator.

A second aspect relates to a method for operating a delay circuit. The delay circuit includes a delay line and a bias generator configured to bias the delay line, and the bias generator includes a clock input. The method includes inputting a first clock signal to the clock input of the bias generator for a time duration, and inputting a second clock signal to the clock input of the bias generator after the time duration, wherein the first clock signal has a higher frequency than the second clock signal.

A third aspect relates to an apparatus for operating a delay circuit. The delay circuit includes a delay line and a bias generator configured to bias the delay line, and the bias generator includes a clock input. The apparatus includes means for inputting a first clock signal to the clock input of the bias generator for a time duration, and means for inputting a second clock signal to the clock input of the bias generator after the time duration, wherein the first clock signal has a higher frequency than the second clock signal.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
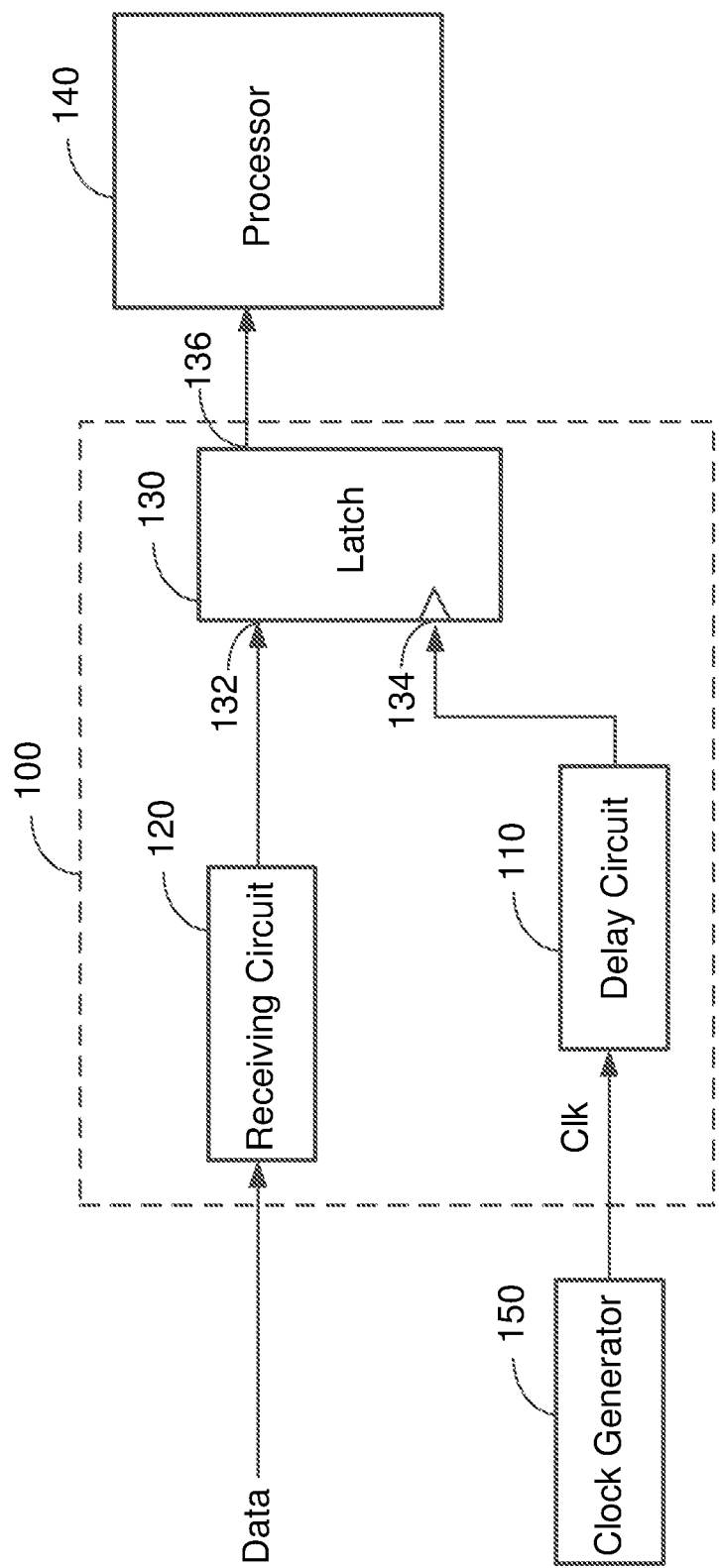
FIG. 1 shows an example of a receiver including a delay circuit according certain aspects of the present disclosure.

Delay circuits may be used to adjust the timing of a signal by delaying the signal by a certain time delay. For example, a delay circuit may be used to adjust the timing of a signal (e.g., a data signal or a clock signal) in a physical layer (PHY) receiver or transmitter. In this regard, FIG. 1 shows an example of a PHY receiver 100 including a delay circuit 110 according to certain aspects. The PHY receiver 100 may be configured to receive a data signal from a PHY transmitter (not shown) over a data link (e.g., one or more metal traces, one or more wires, a cable, etc.). In one example, the PHY transmitter and the PHY receiver 100 may be used to provide communication between two devices, in which the PHY transmitter is located in one of the devices and the PHY receiver 100 is located in the other one of the devices. The devices may include a double data rate dynamic random-access memory (DDR DRAM) device and a processor, a modem and a processor, or other types of devices.

In this example, the PHY receiver 100 includes a receiving circuit 120 and a latch 130. The receiving circuit 120 may be configured to receive the data signal from the data link, and perform pre-processing on the data signal. The pre-processing may include amplification, equalization, etc. The latch 130 includes a data input 132 coupled to the output of the receiving circuit 120, a clock input 134 coupled to the delay circuit 110, and an output 136. The delay circuit 110 is configured delay the clock signal (labeled "Clk") to adjust the timing of the clock signal relative to the data signal, as discussed further below.

During operation, the latch 130 receives the data signal from the receiving circuit 120 at the data input 132 and receives the clock signal from the delay circuit 110 at the clock input 134. The latch 130 is configured to sample data in the data signal on sampling edges of the clock signal. The sampling edges may include rising edges, falling edges, or both. In this example, the delay circuit 110 may be used to position the sampling edges of the clock signal in the center of the data eye of the data signal to enable the latch 130 to properly sample the data. The latch 130 may output the latched data to a processor 140 for further processing. In this example, the clock signal may be generated by a clock generator 150 (e.g., a phase locked loop (PLL)). The clock generator 150 may be located at the PHY receiver 100, or located at the PHY transmitter and transmitted to the PHY receiver 100 over a clock link.

It is to be appreciated that a delay circuit is not limited to the example shown in FIG. 1. For example, a delay circuit may also be used to adjust the timing of a data signal or another type of signal. In another example, a delay circuit may be used in a PHY transmitter to adjust the timing of a data signal or a clock signal in the PHY transmitter. In still another example, a delay circuit may be used in sequential logic to adjust the timing of a signal in order to meet setup and hold times of latches in the sequential logic.

Figure 2:
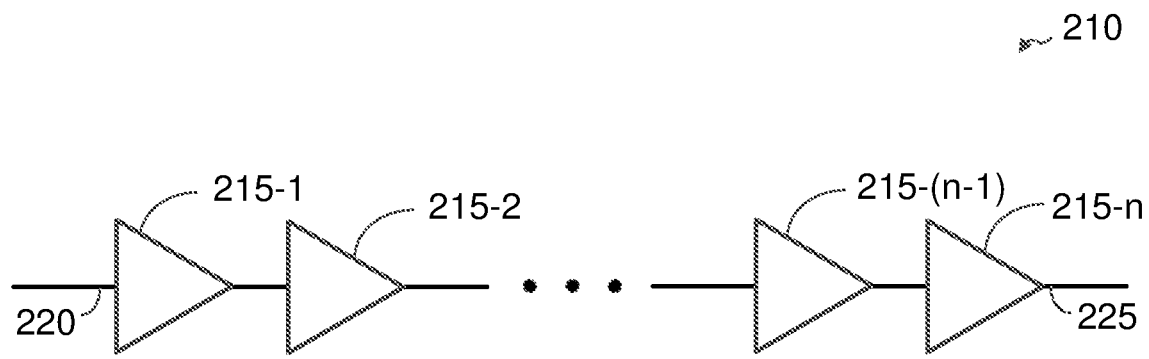
FIG. 2 shows an example of a delay circuit including delay elements coupled in series according to certain aspects of the present disclosure.

FIG. 2 shows an example of a delay circuit 210 according to aspects of the present disclosure. The delay circuit 210 may be used to implement the delay circuit 110 shown in FIG. 1. In this example, the delay circuit 210 includes multiple delay elements 215-1 to 215-n coupled in series between an input 220 and an output 225 of the delay circuit 210. The delay elements 215-1 to 215-n may also be referred to as delay cells or delay buffers. In certain aspects, the delay elements 215-1 to 215-n may each have approximately a same time delay of $t_d$. In these aspects, the total time delay of the delay circuit 210 is approximately equal to n times $t_d$, where n is the number of delay elements 215-1 to 215-n. It is to be appreciated that the delay elements 215-1 to 215-n may have different time delays in other implementations.

In certain aspects, each delay element 215-1 to 215-n may be referred to as a stage of the delay circuit 210. In these aspects, the delay circuit 210 includes n number of stages, in which the total delay of the delay circuit 210 is equal to the number of stages times the time delay of each stage (e.g., $t_d$). Thus, the time delay of the delay circuit 210 may be adjusted by adjusting the number of stages (i.e., number of delay elements 215-1 to 215-n) in the delay circuit 210 and/or adjusting the time delay of each stage (i.e., time delay of each delay element 215-1 to 215-n).

Figure 3:
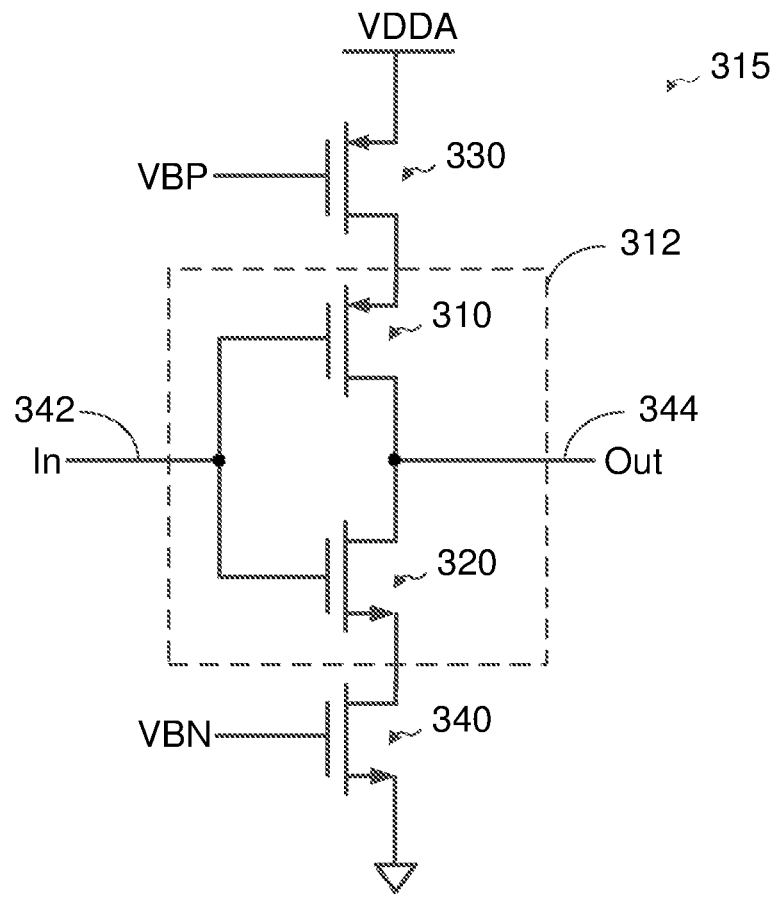
FIG. 3 shows an example of a current-starved delay element according to certain aspects of the present disclosure.

FIG. 3 shows an example of a delay element 315 according to certain aspects of the present disclosure. The delay element 315 may be used to implement each of the delay elements 215-1 to 215-n shown in FIG. 2 (i.e., each of the delay elements 215-1 to 215-n may be a separate instance of the delay element 315 shown in FIG. 3). In this example, the delay element 315 includes an inverter 312 including a first transistor 310 and a second transistor 320. In the example in FIG. 3, the first transistor 310 is implemented with a p-type field effect transistor (PFET) and the second transistor 320 is implemented with an n-type field effect transistor (NFET). The first transistor 310 includes a gate coupled to the input 342 of the delay element 315, a source, and a drain coupled to the output 344 of the delay element 315. The second transistor 320 includes a gate coupled to the input 342 of the delay element 315, a source, and a drain coupled to the output 344 of the delay element 315. As discussed further below, the inverter 312 is configured to invert the signal at the input 342 of the delay element 315 and output the inverted signal at the output 344 of the delay element 315. In this example, the delay element 315 is an inverting delay element.

The delay element 315 also includes a third transistor 330 and a fourth transistor 340. In the example in FIG. 3, the third transistor 330 is implemented with a PFET and the fourth transistor 340 is implemented with an NFET. The third transistor 330 includes a gate biased by a first bias voltage VBP, a source coupled to a supply rail VDDA, and a drain coupled to the source of the first transistor 310. The fourth transistor 340 includes a gate biased by a second bias voltage VBN, a source coupled to ground, and a drain coupled to the source of the second transistor 320.

In this example, when a low voltage is input to the input 342 of the delay element 315, the first transistor 310 is turned on and the second transistor 320 is turned off. This causes the first transistor 310 to charge the capacitance at the output 344 of the delay element 315, thereby raising the voltage at the output 344 of the delay element 315. The third transistor 330 (which is coupled between the supply rail VDDA and the first transistor 310) controls the charging current of the first transistor 310 based on the first bias voltage VBP, and therefore controls the rise time of the delay element 315 based on the first bias voltage VBP. The lower the first bias voltage VBP, the larger the charging current, and hence the faster the rise time.

When a high voltage is input to the input 342 of the delay element 315, the second transistor 320 is turned on and the first transistor 310 is turned off. This causes the second transistor 320 to discharge the capacitance at the output 344 of the delay element 315, thereby lowering the voltage at the output 344 of the delay element 315. The fourth transistor 340 (which is coupled between the second transistor 320 and ground) controls the discharging current of the second transistor 320 based on the second bias voltage VBN, and therefore controls the fall time of the delay element 315 based on the second bias voltage VBN. The higher the second bias voltage VBN, the larger the discharging current, and hence the faster the fall time.

Thus, the third transistor 330 controls the rise time of the delay element 315 based on the first bias voltage VBP, and the fourth transistor 340 controls the fall time of the delay element 315 based on the second bias voltage VBP. This allows the time delay of the delay element 315 to be adjusted by adjusting the first bias voltage VBP and/or the second bias voltage VBN. In this example, the delay element 315 may be referred to as a current-starved delay element.

Figure 4:
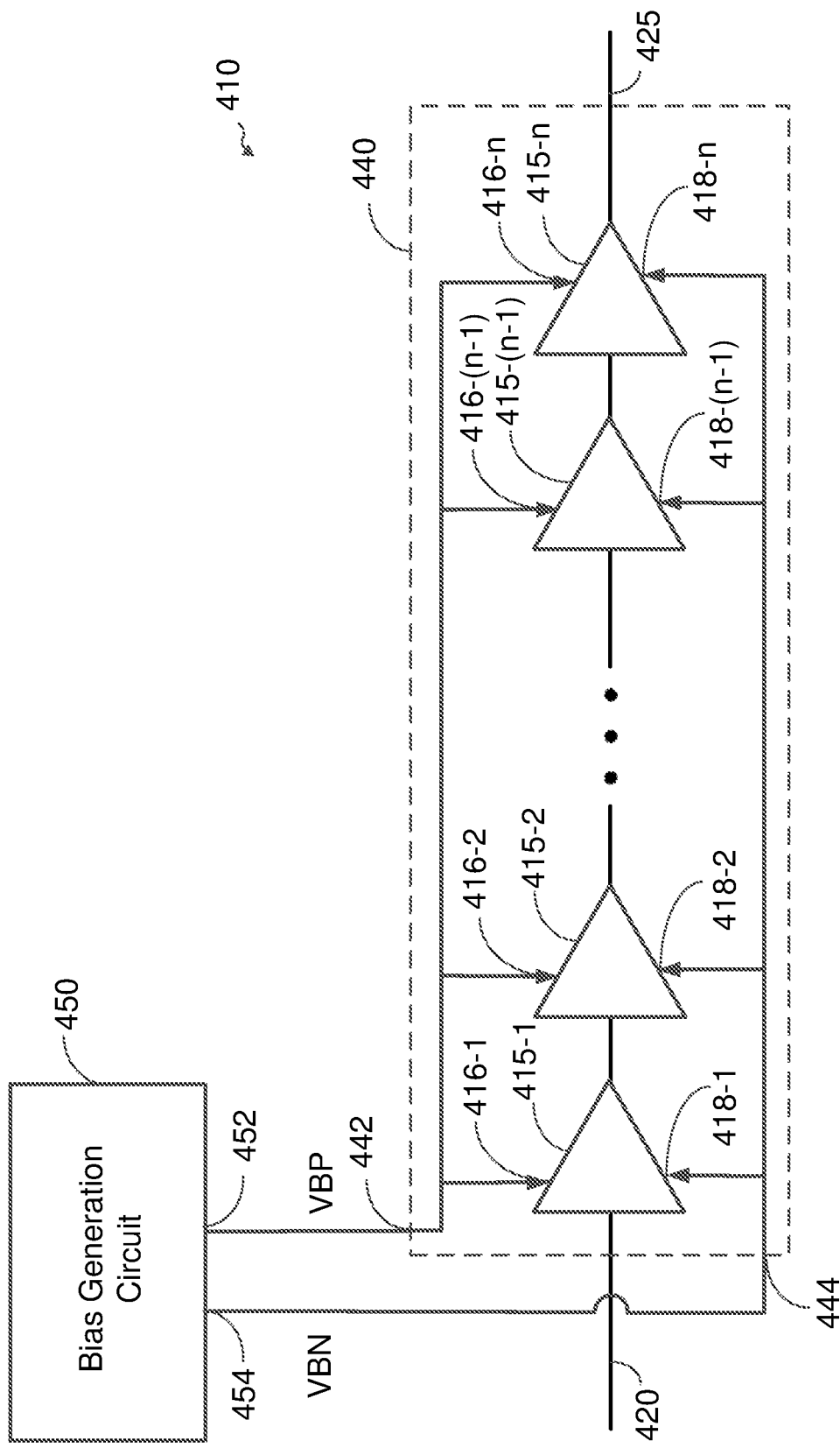
FIG. 4 shows another example of a delay circuit including delay elements according to aspects of the present disclosure.

FIG. 4 shows an example of a delay circuit 410 including a delay line 440 and a bias generation circuit 450 according to certain aspects of the present disclosure. The delay line 440 includes a delay input 420, a delay output 425, a first bias input 442, and a second bias input 444. The delay line 440 includes multiple delay elements 415-1 to 415-$n$ coupled in series between the delay input 420 and the delay output 425. Each of the delay elements 415-1 to 415-$n$ may be implemented with the delay element 315 shown in FIG. 3 (i.e., each of the delay elements 415-1 to 415-$n$ may be a separate instance of the delay element 315 in FIG. 3). In this disclosure, a "delay input" is understood to be an input that receives a signal to be delayed, and a "delay output" is understood to be an output that outputs the resulting delayed signal.

The first bias input 442 is coupled to a first bias input 416-1 to 416-$n$ of each of the delay elements 415-1 to 415-$n$. For the example in which each of the delay elements 415-1 to 415-$n$ is implemented with the delay element 315 in FIG. 3, the first bias input 416-1 to 416-$n$ of each of the delay elements 415-1 to 415-$n$ is coupled to the gate of the respective third transistor 330 (shown in FIG. 3) of the delay element.

The second bias input 444 is coupled to a second bias input 418-1 to 418-$n$ of each of the delay elements 415-1 to 415-$n$. For the example in which each of the delay elements 415-1 to 415-$n$ is implemented with the delay element 315 in FIG. 3, the second bias input 418-1 to 418-$n$ of each of the delay elements 415-1 to 415-$n$ is coupled to the gate of the respective fourth transistor 340 (shown in FIG. 3) of the delay element.

The bias generation circuit 450 includes a first output 452 coupled to the first bias input 442 of the delay line 440, and a second output 454 coupled to the second bias input 444 of the delay line 440. The bias generation circuit 450 is configured to generate the first bias voltage VBP, and output the first bias voltage VBP at the first output 452. Thus, in this example, the first bias voltage VBP is input to the first bias input 442 of the delay line 440. The bias generation circuit 450 is also configured to generate the second bias voltage VBN, and output the second bias voltage VBN at the second output 454. Thus, in this example, the second bias voltage VBN is input to the second bias input 444 of the delay line 440.

During operation, the bias generation circuit 450 is configured to set the first bias voltage VBP and the second bias voltage VBN based on a desired time delay for the delay line 440. In one example, the delay circuit 410 may be used to implement the delay circuit 110 in FIG. 1. In this example, the delay input 420 may be coupled to the clock generator 150, and the delay output 425 may be coupled to the clock input 134 of the latch 130. In this example, the bias generation circuit 450 may be configured to set the first bias voltage VBP and the second bias voltage VBN to set the time delay of the delay line 440 to a time delay that aligns the clock signal at approximately the center of the data eye of the data signal being latched by the latch 130. In certain aspects, the bias generation circuit 450 may adjust the first bias voltage VBP and/or the second bias voltage VBN in response to process-voltage-temperature (PVT) variations in order to maintain an approximately constant time delay for the delay circuit 410 across PVT variations.

Figure 5:
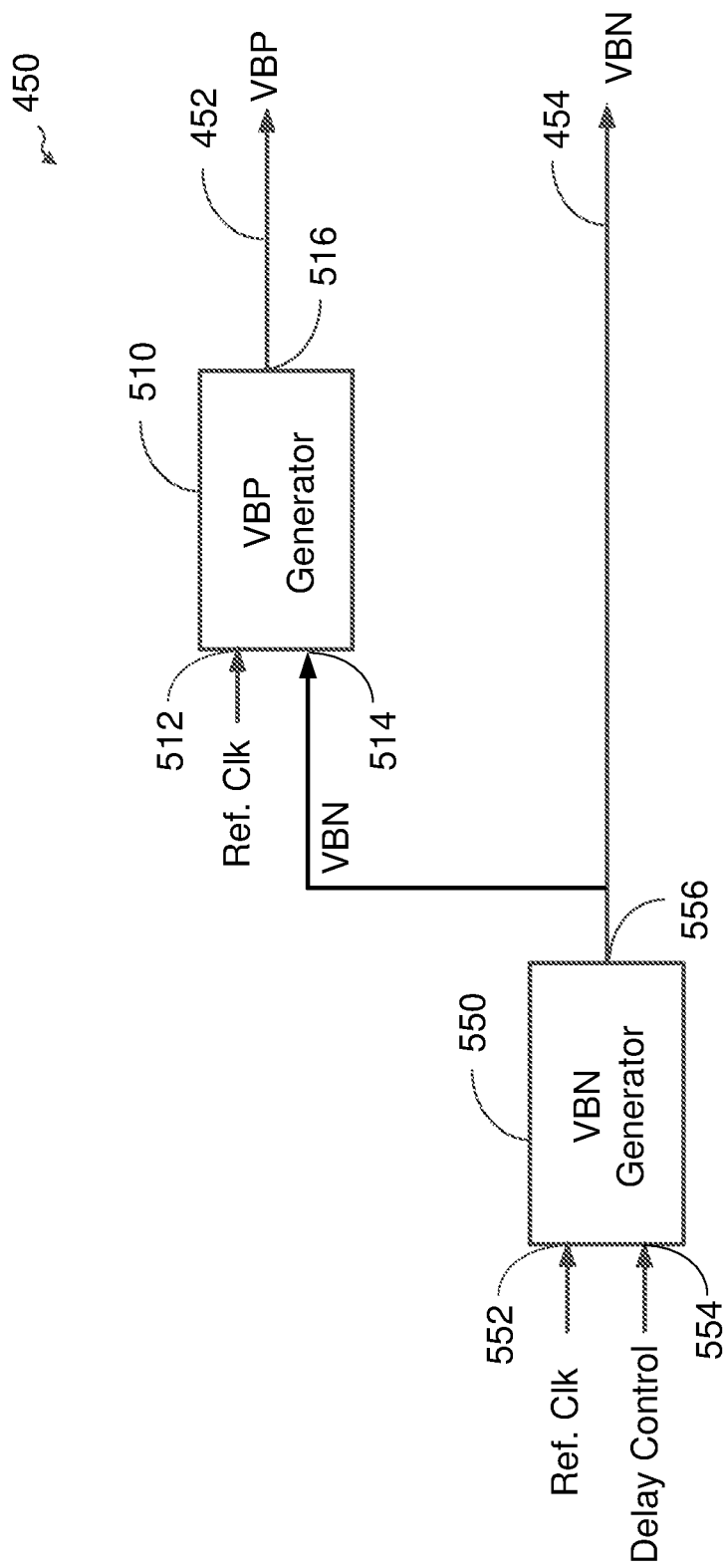
FIG. 5 shows an example of a bias generation circuit for biasing delay elements in a delay circuit according to certain aspects of the present disclosure.

FIG. 5 shows an exemplary implementation of the bias generation circuit 450 according to certain aspects of the present disclosure. In this example, the bias generation circuit 450 includes a first bias generator 510 configured to generate the first bias voltage VBP, and a second bias generator 550 configured to generate the second bias voltage VBN.

In certain aspects, the second bias generator 550 includes a control input 554, a clock input 552, and a bias output 556 coupled to the second output 454 of the bias generation circuit 450. The second bias generator 550 is configured to receive a delay control signal at the control input 554, set the second bias voltage VBN based on the delay control signal, and output the second bias voltage VBN at the bias output 556. As discussed further below, the second bias generator 550 allows the time delay of the delay line 440 to be programmed using the delay control signal. In the example in FIG. 5, the second bias generator 550 also receives a reference clock signal (labeled "Ref. Clk") at the clock input 552. The reference clock signal may be used to time operations of the second bias generator 550, as discussed further below.

In certain aspects, the first bias generator 510 includes a bias input 514 coupled to the bias output 556 of the second bias generator 550, a clock input 512, and a bias output 516 coupled to the first output 452 of the bias generation circuit 450. The first bias generator 510 is configured to receive the second bias voltage VBN at the bias input 514, set the first bias voltage VBP based on the second bias voltage VBN, and output the first bias voltage VBP at the bias output 516. In certain aspects, the first bias generator 510 may be configured to set the first bias voltage VBP based on the second bias voltage VBN such that the rise times and the fall times of the delay elements 415-1 to 415-$n$ in the delay line 440 are approximately equal. In the example in FIG. 5, the first bias generator 510 also receives the reference clock signal at the clock input 512. The reference clock signal may be used to time operations of the first bias generator 510, as discussed further below.

Figure 6:
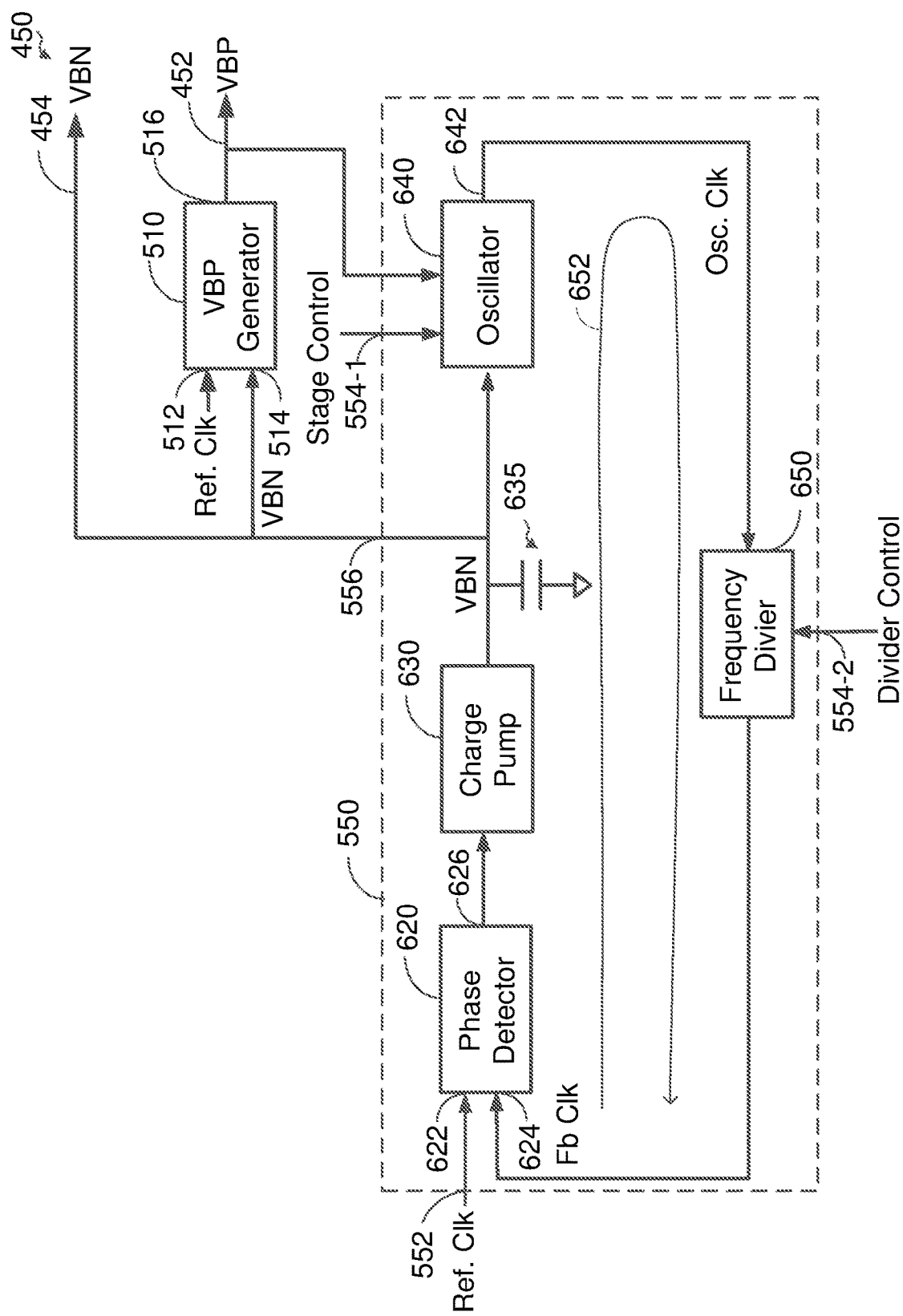
FIG. 6 shows an exemplary implementation of a bias generator according to certain aspects of the present disclosure.

FIG. 6 shows an exemplary implementation of the second bias generator 550 according to aspects of the present disclosure. In this example, the second bias generator 550 includes a phase detector 620, a charge pump 630, a bias capacitor 635, an oscillator 640, and a frequency divider 650. The phase detector 620 is configured to receive the reference clock signal at a first input 622 and a feedback clock signal (labeled "Fb Clk.) at a second input 624. The phase detector 620 is also configured to generate a phase error signal based on a phase difference between the reference clock signal and the feedback clock signal, and output the phase error signal at an output 626. The reference clock signal may come from a stable clock source (e.g., a crystal oscillator), which may be insensitive to PVT variations. In one example, the reference clock signal may have a frequency of approximately 19.2 MHz.

The charge pump 630 is coupled to the output 626 of the phase detector 620. The charge pump 630 is configured to receive the phase error signal from the phase detector 620, and charge or discharge the bias capacitor 635 based on the phase error to generate the second bias voltage VBN. For example, the phase error signal may indicate whether the feedback clock signal leads or lags the reference clock signal, and the charge pump 630 may charge or discharge the bias capacitor 635 depending on whether the feedback clock signal leads or lags the reference clock signal. In the example in FIG. 6, the second bias voltage VBN corresponds to the voltage of the bias capacitor 635, which is coupled to the second output 454 of the bias generation circuit 450.

The oscillator 645 is configured to receive the first bias voltage VBP and the second bias voltage VBN, and generate an oscillator clock signal (labeled "Osc. Clk") having a frequency that is a function of the first bias voltage VBP and the second bias voltage VBN. In one example, the oscillator 640 is implemented with a ring oscillator including multiple delay elements (not shown) coupled in an oscillating loop that generates the oscillator clock signal. In this example, each of the delay elements in the oscillator 640 may be implemented with the exemplary delay element 315 shown in FIG. 3, and each of the delay elements in the oscillator 640 may be biased by the first bias voltage VBP and the second bias voltage VBN.

The frequency divider 650 is coupled to the output 642 of the oscillator 640. The frequency divider 650 is configured to divide the frequency of the oscillator clock signal by a divider N to generate the feedback clock signal, which is fed back to the second input 624 of the phase detector 620. This forms a negative feedback loop 652 that adjusts the second bias voltage VBN in a direction that reduces the phase difference between the reference clock signal and the feedback clock signal input to the phase detector 620. When the negative feedback loop 652 is locked, the negative feedback loop 652 sets the second bias voltage VBN to a voltage that causes the frequency of the oscillator clock signal to be approximately equal to N times the frequency of the reference clock signal, where N is the divider of the frequency divider 650. As a result, one period of the oscillator 640 is given by:

$$T_{osc} = \frac{T_{ref}}{N} \quad (1)$$

where $T_{osc}$ is one period of the oscillator clock signal (also referred to as the oscillator period) and $T_{ref}$ is one period of the reference clock signal (also referred to as the reference period). The oscillator period may be given by:

$$T_{osc} = 2mt_d \quad (2)$$

where m is the number of stages in the oscillator 640, and $t_d$ is the time delay of each of the delay elements in the oscillator 640, assuming the delay elements have approximately the same time delay. Substituting the expression for the oscillator period $T_{osc}$ in equation (2) into equation (1), and solving for the time delay $t_d$ results in the following:

$$t_d = \frac{T_{ref}}{2mN} \quad (3)$$

where N is the divider of the frequency divider 650, and m is the number of stages in the oscillator 640. The frequency of the reference clock signal may be fixed (e.g., at approximately 19.2 MHz), in which case the reference period $T_{ref}$ in equation (3) may be fixed.

As shown in equation (3) above, the time delay $t_d$ of each delay element in the oscillator 640 may be adjusted by adjusting the divider N of the frequency divider 650 and/or adjusting the number of stages m in the oscillator 640. In this regard, the frequency divider 650 may be implemented with a programmable frequency divider having a programmable divider N, and/or the oscillator 640 may be implemented with a programmable oscillator having a programmable number of stages m. In this example, the time delay $t_d$ of each delay element in the oscillator 640 may be programmed by programming the divider N of the frequency divider 650 and/or programming the number of stages m of the oscillator 640.

In certain aspects, each of the delay elements in the oscillator 640 may be implemented using the same delay element (e.g., delay element 315) as each of the delay elements 415-1 to 415-n in the delay line 440, in which case the time delay of each of the delay elements 415-1 to 415-n in the delay line 440 may be approximately equal to the time delay $t_d$. In this example, the time delay of the delay line 440 (which is approximately equal to n times $t_d$) may be set to a desired time delay by programming the divider N of the frequency divider 650 and/or programming the number of stages m in the oscillator 640 based on the desired time delay. In this regard, FIG. 6 shows an example in which the control input 554 of the second bias generator 550 shown in FIG. 5 includes a first control input 554-1 and a second control input 554-2. In this example, the first control input 554-1 receives a stage control signal that controls the number of stages m in the oscillator 640, and the second control input 554-1 receives a divider control signal that controls the divider N of the frequency divider 650. In this example, the stage control signal and the divider control signal constitute the delay control signal discussed above with reference to FIG. 5, and the stage control signal and the divider control signal may be used individually or in combination to set the time delay of the delay line 440.

It is to be appreciated that the second bias generator 550 is not limited to the exemplary implementation shown in FIG. 6. For example, it is to be appreciated that the second bias generator 550 may include additional components in addition to the components shown in FIG. 6. The frequency divider 650 may be implemented with divide-by-two flip-flops, a pulse-swallowing counter, or another type of frequency divider.

Figure 7:
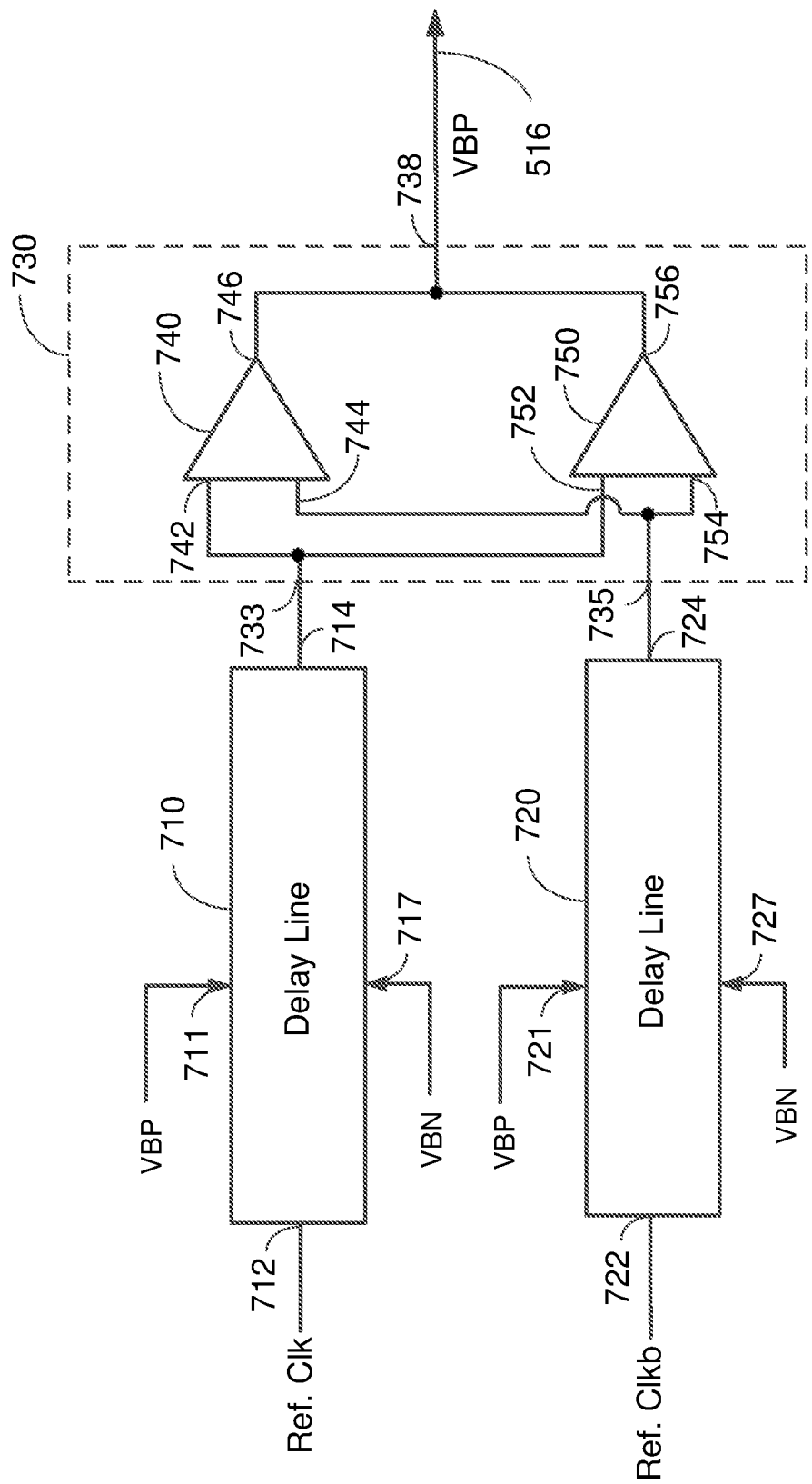
FIG. 7 shows another exemplary implementation of a bias generator according to certain aspects of the present disclosure.

FIG. 7 shows an exemplary implementation of the first bias generator 510 according to aspects of the present disclosure. In this example, the first bias generator 510 includes a first delay line 710, a second delay line 720, and a driver circuit 730. The first delay line 710 includes a delay input 712 configured to receive the reference clock signal, and a delay output 714 coupled to a first input 733 of the driver circuit 730. The first delay line 710 also includes a first bias input 711 configured to receive the first bias voltage VBP, and a second bias input 717 configured to receive the second bias voltage VBN. In one example, the first delay line 710 may include multiple delay elements (not shown in FIG. 7) coupled in series, in which each of the delay elements may be biased by VBP and VBN.

The second delay line 720 includes a delay input 722 configured to receive the inverse of the reference clock signal (labeled "Ref. Clkb"), and a delay output 724 coupled to a second input 735 of the driver circuit 730. The inverse reference clock signal may be generated by inverting the reference clock signal with an inverter (not shown). The second delay line 720 also includes a first bias input 721 configured to receive the first bias voltage VBP, and a second bias input 727 configured to receive the second bias voltage VBN. In one example, the second delay line 720 may include multiple delay elements (not shown in FIG. 7) coupled in series, in which each of the delay elements may be biased by VBP and VBN.

As discussed above, the reference clock signal is input to the first delay line 710 and the inverse reference clock signal is input to the second delay line 720. The first delay line 710 delays the reference clock signal and outputs the delayed reference clock signal to the first input 733 of the driver circuit 730. The second delay line 720 delays the inverse reference clock signal and outputs the delayed inverse reference clock signal to the second input 735 of the driver circuit 730. The output 738 of the driver 738 is coupled to the output 516 of the first bias generator 510. As discussed further below, the driver circuit 730 is configured to adjust the first bias voltage VBP at the output 516 of the first bias generator 510 based on the delayed reference clock signal and the delayed inverse reference clock signal.

In certain aspects, the delayed reference clock signal and the delayed inverse reference clock signal provide the driver circuit 730 with feedback indicating a difference between the rising times and the falling times of the delay elements in the first and second delay lines 710 and 720. If the rising times and the falling times are approximately equal, then the rising edges of the delayed reference clock signal should be approximately aligned with the falling edges of the delayed inverse reference clock signal, and vice versa. A deviation from this alignment indicates a difference between the rising times and the falling times. In this example, the driver circuit 730 is configured to adjust the first bias voltage VBP in a direction that reduces the misalignment, and hence reduces the difference between the rising times and the falling times of the delay elements in the first and second delay lines 710 and 720.

Each of the delay elements in the first and second delay lines 710 and 720 may be implemented using the same delay element (e.g., delay element 315) as each of the delay elements 415-1 to 415-n in the delay line 440. Therefore, by adjusting the first bias voltage VBP in a direction that reduces the difference between the rising times and the falling times of the delay elements in the first and second delay lines 710 and 720, the driver circuit 730 also reduces the difference between the rising times and the falling times of the delay elements 415-1 to 415-n in the delay line 440.

In the example in FIG. 7, the driver circuit 730 includes a first driver 740 and a second driver 750. The first driver 740 includes a first input 742 coupled to the first input 733 of the driver circuit 730, a second input 744 coupled to the second input 735 of the driver circuit 730, and an output 746 coupled to the output 738 of the driver circuit 730. The second driver 750 includes a first input 752 coupled to the first input 733 of the driver circuit 730, a second input 754 coupled to the second input 735 of the driver circuit 730, and an output 756 coupled to the output 738 of the driver circuit 730. In certain aspects, the first driver 740 may be configured to increase the first bias voltage VBP when the rising time of the delayed reference clock signal is faster than the falling time of the delayed inverse reference clock signal and/or the rising time of the delayed inverse reference clock signal is faster than the falling time of the delayed reference clock signal. The second driver 750 may be configured to decrease the first bias voltage VBP when the rising time of the delayed reference clock signal is slower than the falling time of the delayed inverse reference clock signal and/or the rising time of the delayed inverse reference clock signal is slower than the falling time of the delayed reference clock signal.

It is to be appreciated that the first bias generator 510 is not limited to receiving the reference clock signal. For example, another clock signal may be input to the first delay line 710. In this example, the inverse of the other clock signal is input to the second delay line 720 (e.g., by inverting the other clock signal with an inverter).

When the bias generation circuit 450 is first turned on, it takes time for the first bias voltage VBP and the second bias voltage VBN to settle to respective voltages corresponding to the time delay of the delay line 440 set by the delay control signal. For example, the first bias voltage VBP may start at an initial voltage of approximately zero, and the second bias voltage VBN may start at an initial voltage of approximately VDDA. In this example, it takes time after the bias generation circuit 450 is first turned on for the first bias voltage VBP and the second bias voltage VBN to settle from their respective initial voltages to respective voltages corresponding to the time delay set by the delay control signal. The settling time of the bias voltages determines the latency of powering up the bias generation circuit 450 from a low power state. The longer the settling time of the bias voltages, the longer the latency. The settling time may also be referred to as the lock time.

The latency of the bias generation circuit 450 impacts the system power budget of a system including the delay circuit 410. For instance, for the example in which the delay circuit 410 is implemented in a PHY receiver (e.g., PHY receiver 100) or a PHY transmitter, there may be periods when the data signal is idle. During these idle periods, it may be desirable to turn off the bias generation circuit 450 to lower power consumption. However, if the latency of the bias generation circuit 450 is too long, it may not be feasible to turn off the bias generation circuit 450 during an idle period to reduce power consumption during the idle period. Accordingly, it is desirable to reduce the latency of the bias generation circuit 450 to allow the bias generation circuit 450 to be turned off during idle periods to reduce power consumption.

Aspects of the present disclosure reduce the latency of the bias generation circuit 450 by inputting a fast clock signal to the first bias generator 510 when the bias generation circuit 450 is exiting a low power state. The fast clock signal reduces the settling time (i.e., lock time) of the first bias voltage VBP, thereby reducing the latency of the bias generation circuit 450. After the first bias voltage VBP and the second bias voltage VBN have settled, a slow clock signal (e.g., the reference clock signal) may be input to the first bias generator 510.

Figure 8:
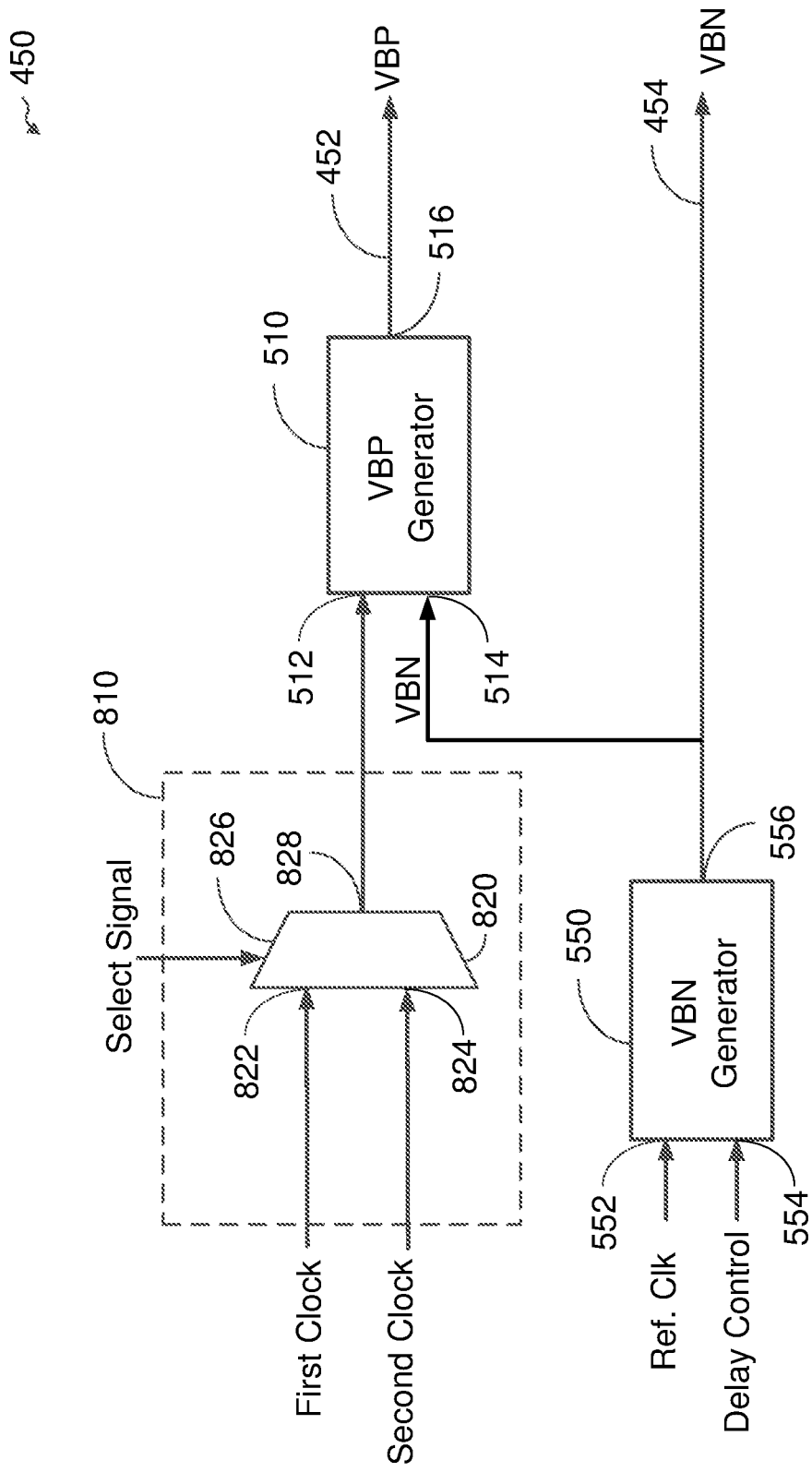
FIG. 8 shows an example of a fast bias circuit including a multiplexer according to certain aspects of the present disclosure.

FIG. 8 shows an example of a fast bias circuit 810 according to certain aspects of the present disclosure. The fast bias circuit 810 is configured to reduce the settling time (lock time) of the first bias voltage VBP (e.g., when exiting a low power state) to reduce the latency of the bias generation circuit 450, as discussed further below.

The fast bias circuit 810 includes a multiplexer 820. The multiplexer 820 includes a first input 822, a second input 824, a select input 826, and an output 828. The first input 822 is configured to receive a first clock signal, the second input 824 is configured to receive a second clock signal, the select input 826 is configured to receive a select signal, and the output 828 is coupled to the clock input 512 of the first bias generator 510. The multiplexer 820 is configured to selectively couple the first clock signal or the second clock signal to the output 828 of the multiplexer 820 (and hence the clock input 512 of the first bias generator 510) based on the select signal received at the select input 826. In one example, the select signal includes a select bit. In this example, the multiplexer 820 couples the first clock signal to the output 828 of the multiplexer 820 if the select signal has a first logic state (e.g., one), and couples the second clock signal to the output 828 of the multiplexer 820 if the select signal has a second logic state (e.g., zero).

The first clock signal has a higher frequency than the second clock signal. For example, the first clock signal may have a frequency that is at least five times higher than the frequency of the second clock signal. The first clock signal may correspond to the fast clock signal discussed above, and the second clock signal may correspond to the slow clock signal discussed above. In one example, the second clock signal may be the reference clock signal.

The multiplexer 820 allows the settling time (i.e., lock time) of the first bias voltage VBP to be reduced, and thus the latency of the bias generation circuit 450 to be reduced (e.g., when exiting a low power state). For example, the select signal may instruct the multiplexer 820 to select the first clock signal during power up, in which case the multiplexer 820 outputs the first clock signal to the clock input 512 of the first bias generator 510. The first clock signal (which has a higher frequency than the second clock signal) reduces the settling time of the first bias voltage VBP, which reduces the latency of the bias generation circuit 450.

After the first bias voltage VBP and the second bias voltage VBN have settled, the select signal may instruct the multiplexer 820 to select the second clock signal. Thus, during normal operation, the multiplexer 820 outputs the second clock signal to the clock input 512 of the first bias generator 510. The second clock signal (which has a lower clock frequency than the first clock signal) reduces the dynamic power consumption of the first bias generator 510 during normal operation compared with the first clock signal. Thus, in this example, the multiplexer 820 selects the first clock signal (e.g., when exiting a low power state) to reduce the latency of the bias generation circuit 450, and switches to the second clock signal after the first bias voltage VBP and the second bias voltage VBN have settled to reduce power consumption during normal operation.

Figure 9:
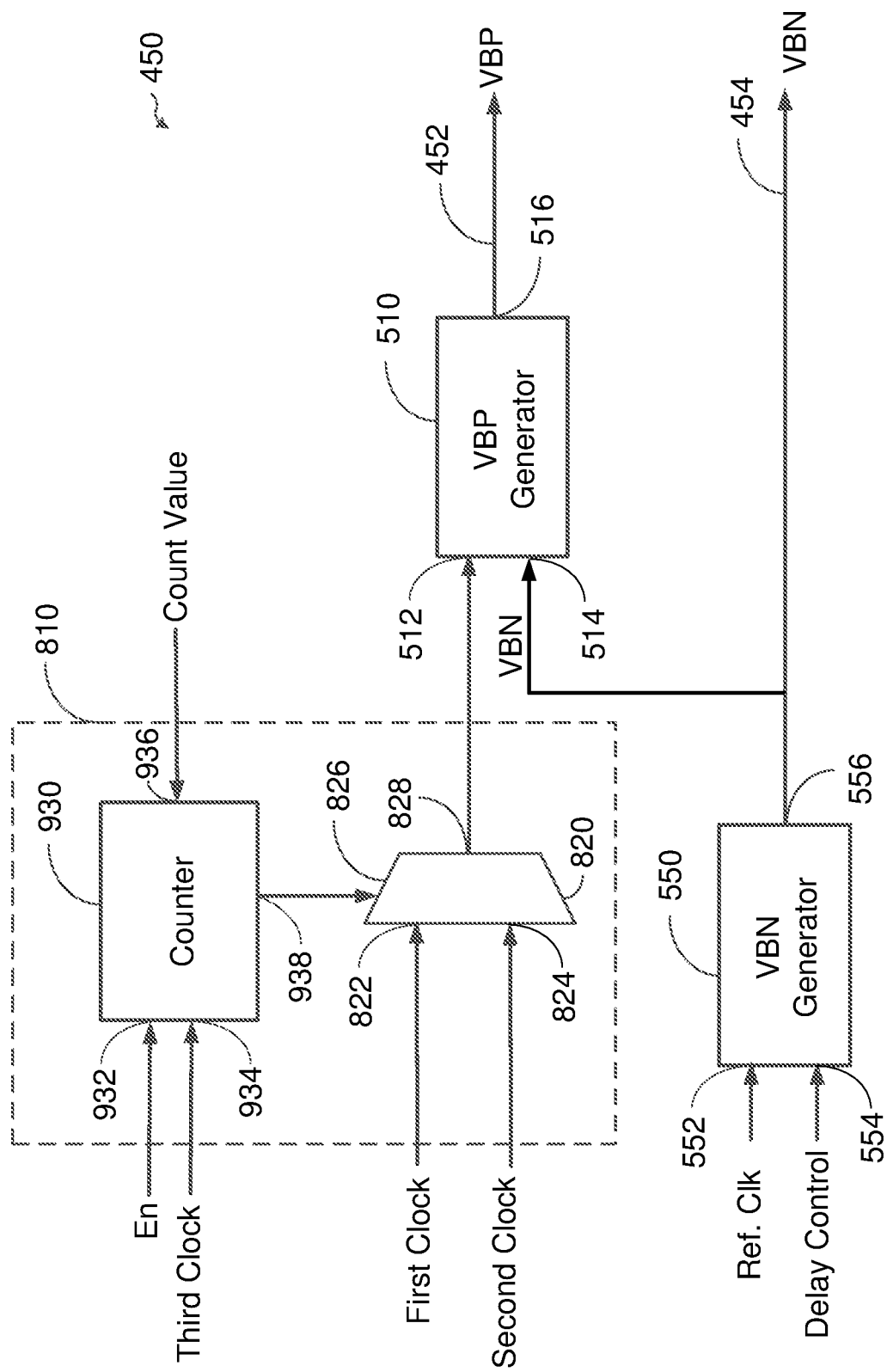
FIG. 9 shows an example of a fast bias circuit including a counter according to certain aspects of the present disclosure.

FIG. 9 shows an example in which the fast bias circuit 810 further includes a counter 930 for generating the select signal. In this example, the counter 930 includes an enable input 932, a clock input 934, a count value input 936, and an output 938. The enable input 932 is configured to receive an enable signal (labeled "En"), the clock input 934 is configured to receive a third clock signal, the count value input 936 is configured to receive a count value, and the output 938 is coupled to the select input 826 of the multiplexer 820. In one example, the third clock signal may be the reference clock signal.

In one example, the logic state of the enable signal may indicate when the system (e.g., PHY receiver or transmitter) including the bias generation circuit 450 is exiting or entering a low power state. For example, the enable signal may transition from zero to one when the system is exiting the low power state. In this example, the enable signal may be provided by a power management circuit (not shown) that manages power for the system including the delay circuit 410.

In this example, the logic state at the output 938 of the counter 930 (which is coupled to the select input 826 of the multiplexer 820) indicates to the multiplexer 820 which of the first clock signal and second clock signal to select. For example, the multiplexer 820 may be configured to select the first clock signal if the first logic state is input to the select input 826, and select the second clock signal if the second logic state is input to the select input 826 of the multiplexer 820. In this example, the first logic state may be one and the second logic state may be zero, or vice versa.

In this example, when the enable signal indicates that the system is exiting the low power state (e.g., transitions from zero to one), the counter 930 is enabled. When the counter 930 is enabled, the counter 930 may begin counting a number of periods of the third clock signal (e.g., the reference clock signal). While the counter 930 is counting, the counter 930 may output the first logic state to the select input 826 of the multiplexer 820, causing the multiplexer 820 to select the first clock signal. When the number of periods of the third clock signal counted by the counter 930 reaches the count value, the counter 930 may output the second logic state to the select input 826 of the multiplexer 820, causing the multiplexer 820 to select the second clock signal. In other words, the counter 930 changes the logic state at the output 938 (e.g., changes the logic state at the output 938 from the first logic state to the second logic state) when the number of periods of the third clock signal reaches the count value.

Thus, when the enable signal indicates that the system is exiting the low power state (e.g., transitions from zero to one), the counter 930 causes the multiplexer 820 to output the first clock signal to the first bias generator 510 for a time duration approximately equal to the period of the third clock signal times the count value. For the example in which the third clock signal is the reference clock signal, the time duration is approximately equal to $T_{ref}$ times the count value. At the end of the time duration, the counter 930 causes the multiplexer 820 to switch to the second clock signal.

In this example, the time duration that the first clock signal is selected by the multiplexer 820 is a function of the count value input to the counter 930. The larger the count value, the longer the time duration. Thus, the count value allows the time duration that the first clock signal is selected to be programmed by programming the count value according to a desired time duration. In certain aspects, the time duration that the first clock signal is selected may be programmed so that the time duration provides enough time for the bias voltage VBP and the second bias voltage VBN to settle before the multiplexer 820 switches to the second clock signal (e.g., the reference clock signal). The time duration may be determined by performing computer simulations or tests on the bias generation circuit 450 to determine how long it takes for the bias voltages to settle when the first clock signal in input to the first bias generator 510.

In one example, the counter 930 may be implemented with a count-down counter. In this example, a count of the counter 930 is initialized at the count value that is input to the count value input 936 of the counter 930. When enabled by the enable signal, the counter 930 counts down from the initial count value, in which the count of the counter 930 is decremented for each period of the third clock signal. In this example, the counter 930 may change the select signal from the first logic state to the second logic state when the count reaches zero (i.e., the counter 930 counts down to zero). At this point, the multiplexer 820 switches from the first clock signal to the second clock signal.

Figure 10:
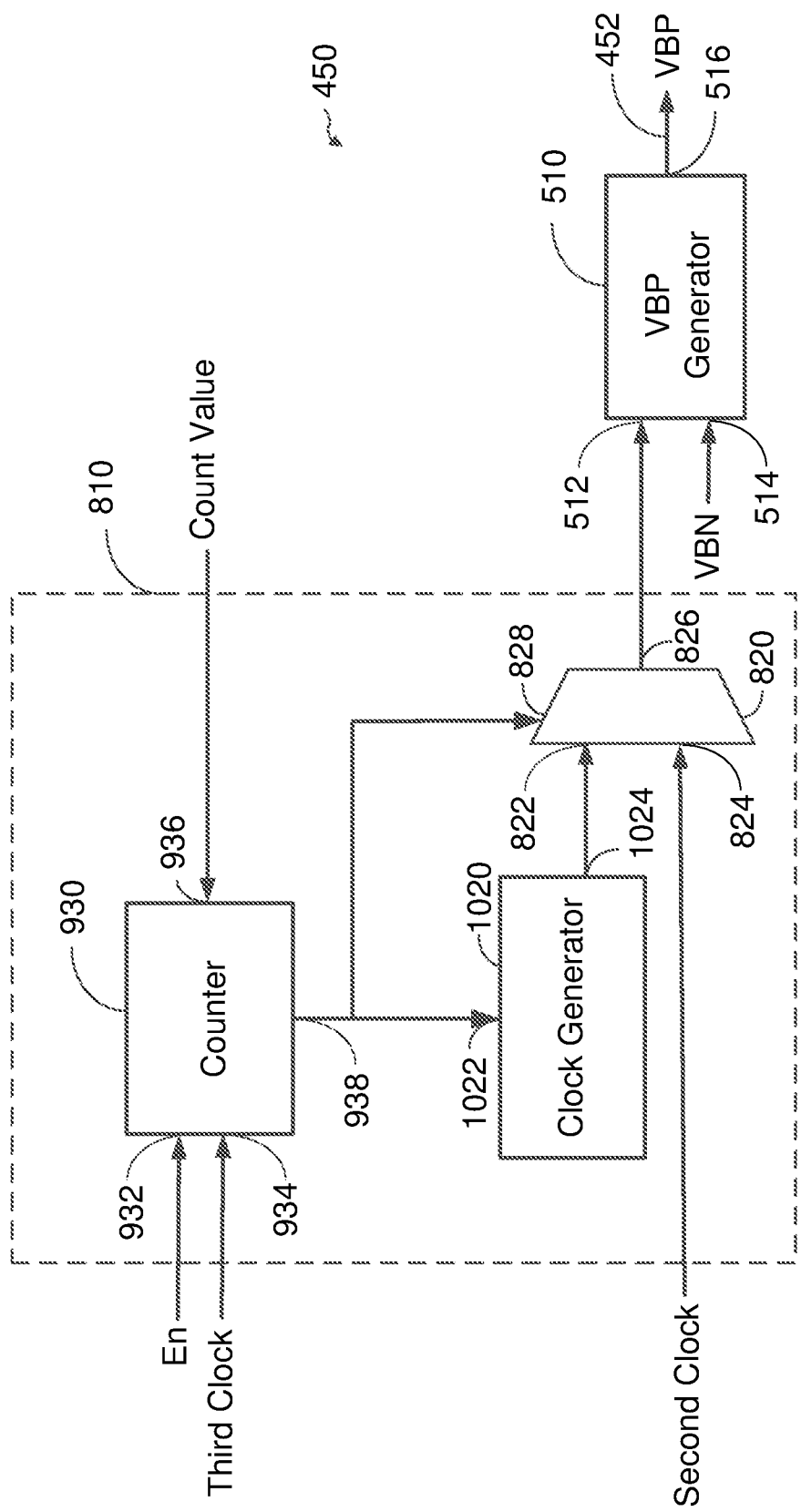
FIG. 10 shows an example of a fast bias circuit including a clock generator according to certain aspects of the present disclosure.

FIG. 10 shows an example in which the fast bias circuit 810 further includes a clock generator 1020 for generating the first clock signal. In this example, the clock generator 1020 include an enable input 1022 coupled to the output 938 of the counter 930, and a clock output 1024 coupled to the first input 822 of the multiplexer 820.

The clock generator 1020 is enabled or disabled based on the logic state at the output 938 of the counter 930. Thus, in this example, the output 938 of the counter 930 is used both to enable or disable the clock generator 1020 and to control the selection of the multiplexer 820, as discussed above. In one example, the clock generator 1020 is enabled when the output 938 of the counter 930 is at the first logic state, which also causes the multiplexer 820 to select the first input 822. Thus, the clock generator 1020 is enabled at the same time that the multiplexer 820 selects the first input 822. When the clock generator 1020 is enabled, the clock generator 1020 is configured to generate the first clock signal and output the first clock signal at the clock output 1024, which is coupled to the first input 822 of the multiplexer 820. Thus, when the clock generator 1020 is enabled, the clock generator 1020 outputs the first clock signal to the first input 822 of the multiplexer 820. Since the multiplexer 820 selects the first input 822 when the clock generator 1020 is enabled, the multiplexer 820 outputs the first clock signal to the first bias generator 510.

The clock generator 1020 is disabled when the output 938 of the counter 930 is at the second logic state, which also causes the multiplexer 820 to select the second clock signal at the second input 824. Thus, the clock generator 1020 is disabled when the multiplexer 820 selects the second clock signal during normal operation. The clock generator 1020 can be disabled during normal operation since the first clock signal is not used during normal operation in this example.

Thus, in this example, the clock generator 1020 is enabled when the first clock signal is needed to reduce the settling time (i.e., lock time) of the first bias voltage VBP. When the bias voltage VBP and the second bias voltage VBN have settled and the multiplexer 820 switches to the second clock signal, the clock generator 1020 is disabled to conserve power.

Figure 11:
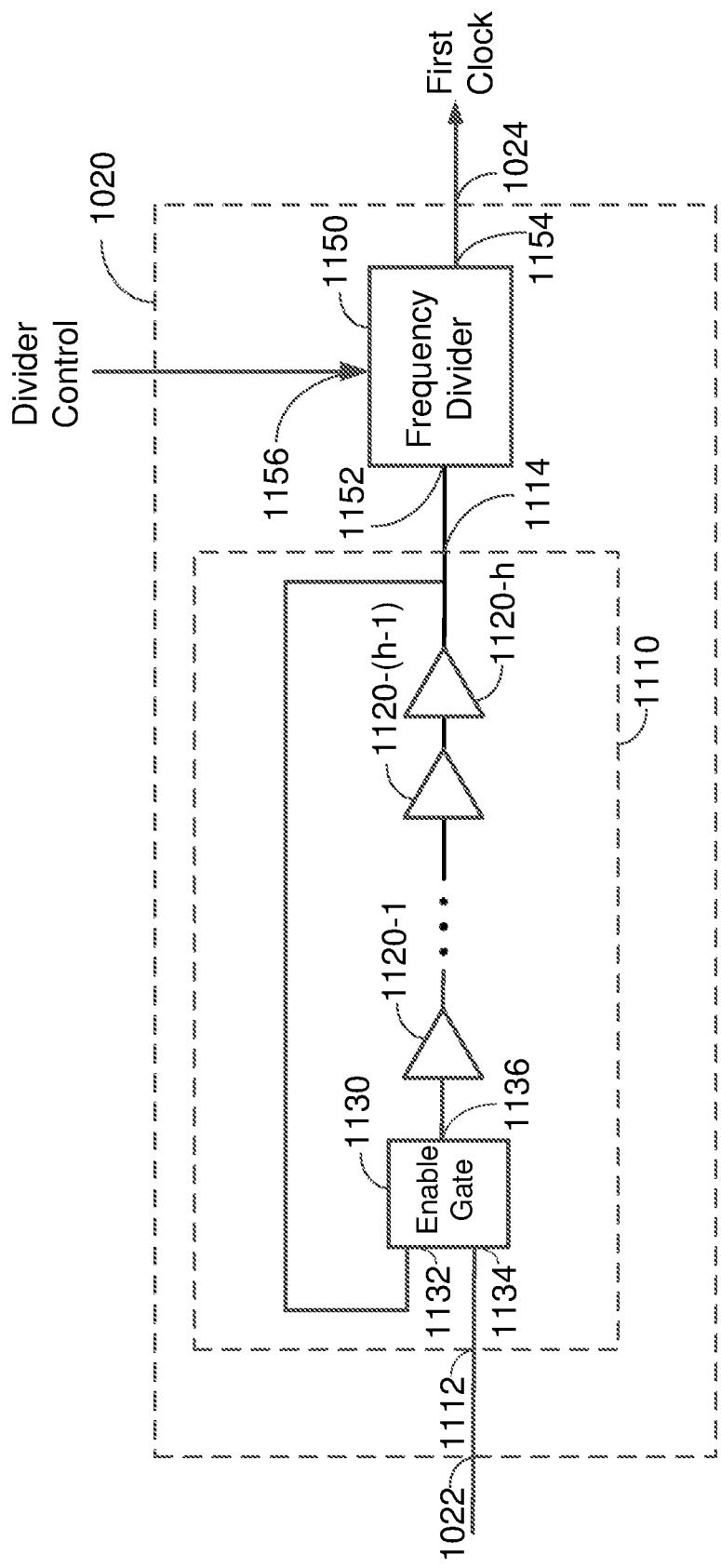
FIG. 11 shows an exemplary implementation of a clock generator according to certain aspects of the present disclosure.

FIG. 11 shows an exemplary implementation of the clock generator 1020 according to certain aspects of the present disclosure. In this example, the clock generator 1020 includes an oscillator 1110 and a frequency divider 1150. The oscillator 1110 includes an enable input 1112 coupled to the enable input 1022 of the clock generator 1020, and a clock output 1114 coupled to the frequency divider 1150. The frequency divider 1150 (also referred to as a clock divider) includes a clock input 1152 coupled to the clock output 1114 of the oscillator 1110, a clock output 1154 coupled to the clock output 1024 of the clock generator 1020, and a control input 1156 configured to receive a divider control signal.

In this example, the oscillator 1110 is a ring oscillator including multiple delay elements 1120-1 to 1120-h coupled in series. Each of the delay elements 1120-1 to 1120-h may be implemented with the exemplary delay element 315 shown in FIG. 3 or another delay element.

The oscillator 1110 also includes an enable gate 1130 for enabling or disabling the oscillator 1110. The enable gate 1130 includes a first input 1132 coupled to the output of delay element 1120-h, a second input 1134 coupled to the enable input 1112 of the oscillator 1110, and an output 1136 coupled to the input of delay element 1120-1. The second input 1134 of the enable gate 1130 is coupled to the output 938 of the counter 930 (shown in FIG. 10) via the enable input 1022 of the clock generator 1020. In one example, the enable gate 1130 is configured to enable the oscillator 1110 when the logic state at the second input 1134 is at the first logic state discussed above. The enable gate 1130 enables the oscillator 1110 by coupling the first input 1132 of the enable gate 1130 to the output 1136 of the enable gate 1130. This couples the output of delay element 1120-h to the input of delay element 1120-1, which forms an oscillating loop that generates an oscillator clock signal. The oscillator clock signal is output at the clock output 1114 of the oscillator 1110.

The enable gate 1130 is configured to disable the oscillator 1110 when the logic state at the second input 1134 is at the second logic state discussed above. The enable gate 1130 disables the oscillator 1110 by decoupling the first input 1132 of the enable gate 1130 from the output 1136 of the enable gate 1130. This decouples the output of delay element 1120-h from the input of delay element 1120-1, which disables the oscillating loop discussed above.

The enable gate 1130 may be implemented with any one of a variety of logic gates. For example, if the first logic state is one and the second logic state is zero, then the enable gate 1130 may be implemented with an AND gate.

The frequency divider 1150 is configured to receive the oscillator clock signal from the oscillator 1110, divide down the frequency of the oscillator clock signal to generate the first clock signal, and output the first clock signal at the clock output 1024 of the clock generator. In certain aspects, the frequency divider 1150 is configured to receive a divider control signal at the control input 1156 that controls the divider of the frequency divider 1150. The divider control signal provides flexibility in programming the frequency of the first clock signal. The divider control signal input to the frequency divider 1150 in the clock generator 1020 may be different from the divider control signal input to the frequency divider 650 in the second bias generator 550.

In certain aspects, the frequency divider 1150 may be omitted. In these aspects, the oscillator clock signal from the oscillator 1110 may be output at the clock output 1024 of the clock generator 1020, in which case the oscillator clock signal is the first clock signal.

It is to be appreciated that the fast bias circuit 810 may include additional components in addition to the components shown in FIGS. 8 to 11. For example, the fast bias circuit 810 may include a logic gate coupled between the output 938 of the counter 930 and the multiplexer 820. In this example, the logic gate may also be coupled between the output 938 of the counter 930 and the clock generator 1020. If the logic gate is inverting, then the counter 930 may output the second logic state to enable the clock generator 1020 and select the first clock signal, and output the first logic state to disable the clock generator 1020 and select the second clock signal. This is because the logic gate inverts the second logic state output by the counter 930 into the first logic state, and inverts the first logic state output by the counter 930 into the second logic state in this example. The first logic state may be a one and the second logic state may be a zero, or vice versa.

As discussed above, the third clock signal may be the reference clock signal. The second clock signal may also be the reference clock signal, in which case both the second clock signal and the third clock signal may be the reference clock signal. As discussed above, the reference clock signal may come from a crystal oscillator. In one example, the reference clock signal has a fixed frequency of approximately 19.2 MHz.

Figure 12:
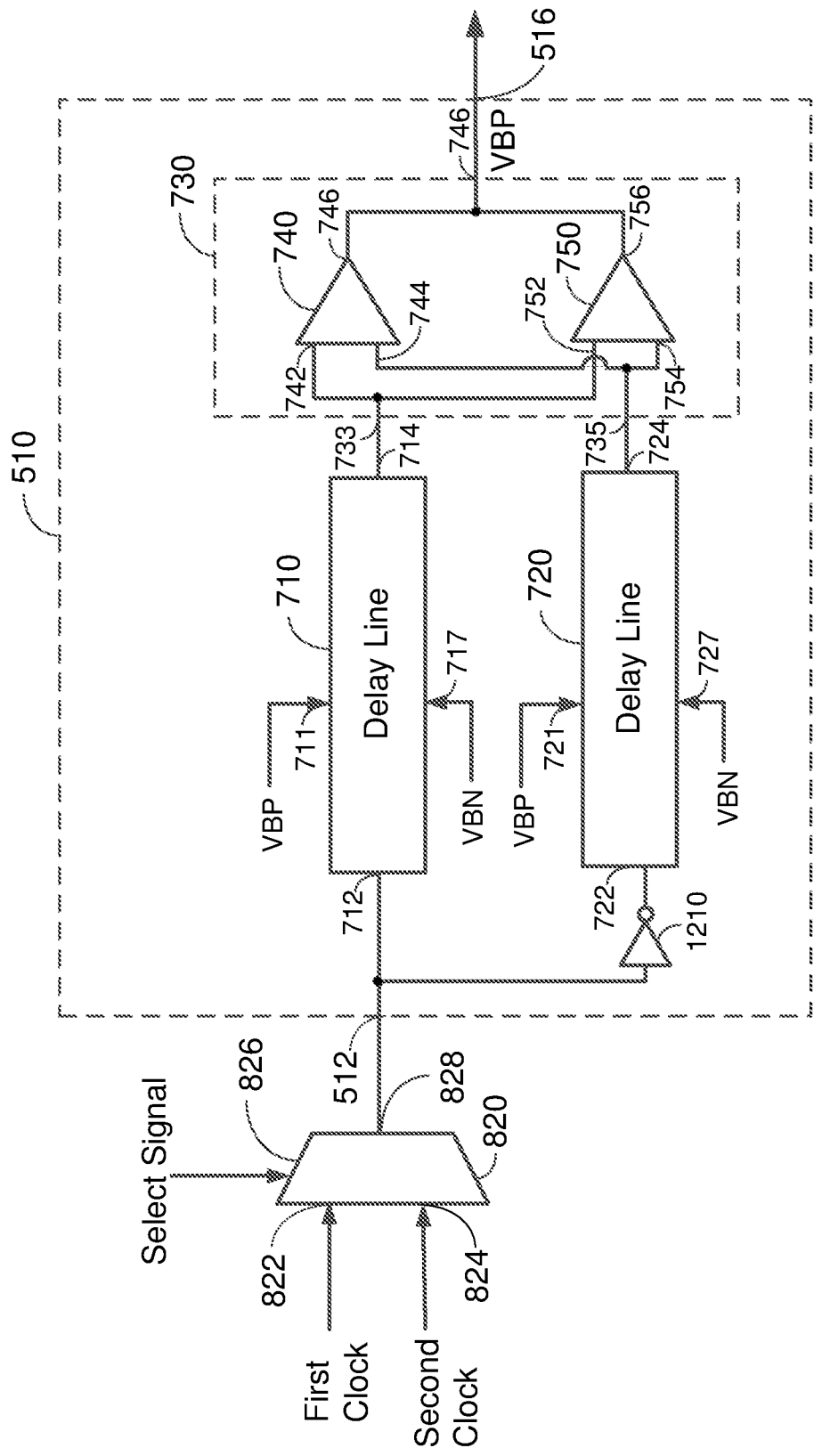
FIG. 12 shows an example of a multiplexer coupled to a bias generator according to certain aspects of the present disclosure.

FIG. 12 shows an example of the multiplexer 820 coupled to the first bias generator 510 in which the first bias generator 510 is implemented with the exemplary implementation shown in FIG. 7. In this example, the output 828 of the multiplexer 820 is coupled to the delay input 712 of the first delay line 710. The output 828 of the multiplexer 820 is also coupled to the delay input 722 of the second delay line 720 via an inverter 1210. This is because the clock signal input to the second delay line 720 is the inverse of the clock signal input to the first delay line 710, as discussed above.

As discussed above, the multiplexer 820 may input the first clock signal to the first bias generator 510 during power up to reduce the settling time (i.e., lock time) of the first bias voltage VBP. In this case, the first clock signal may be input to the first delay line 710 and the inverse of the first clock signal may be input to the second delay line 720. The first clock signal reduces the settling time by having a higher frequency than the second clock signal (e.g., the reference clock signal). The higher frequency of the first clock signal causes the driver circuit 730 to adjust the first bias voltage VBP at a faster rate, which reduces the settling time of the first bias voltage VBP.

After the first bias voltage VBP and the second bias voltage VBN have settled, the multiplexer 820 may input the second clock signal to the first bias generator 510. In this case, the second clock signal may be input to the first delay line 710 and the inverse of the second clock signal may be input to the second delay line 720.

Figure 13:
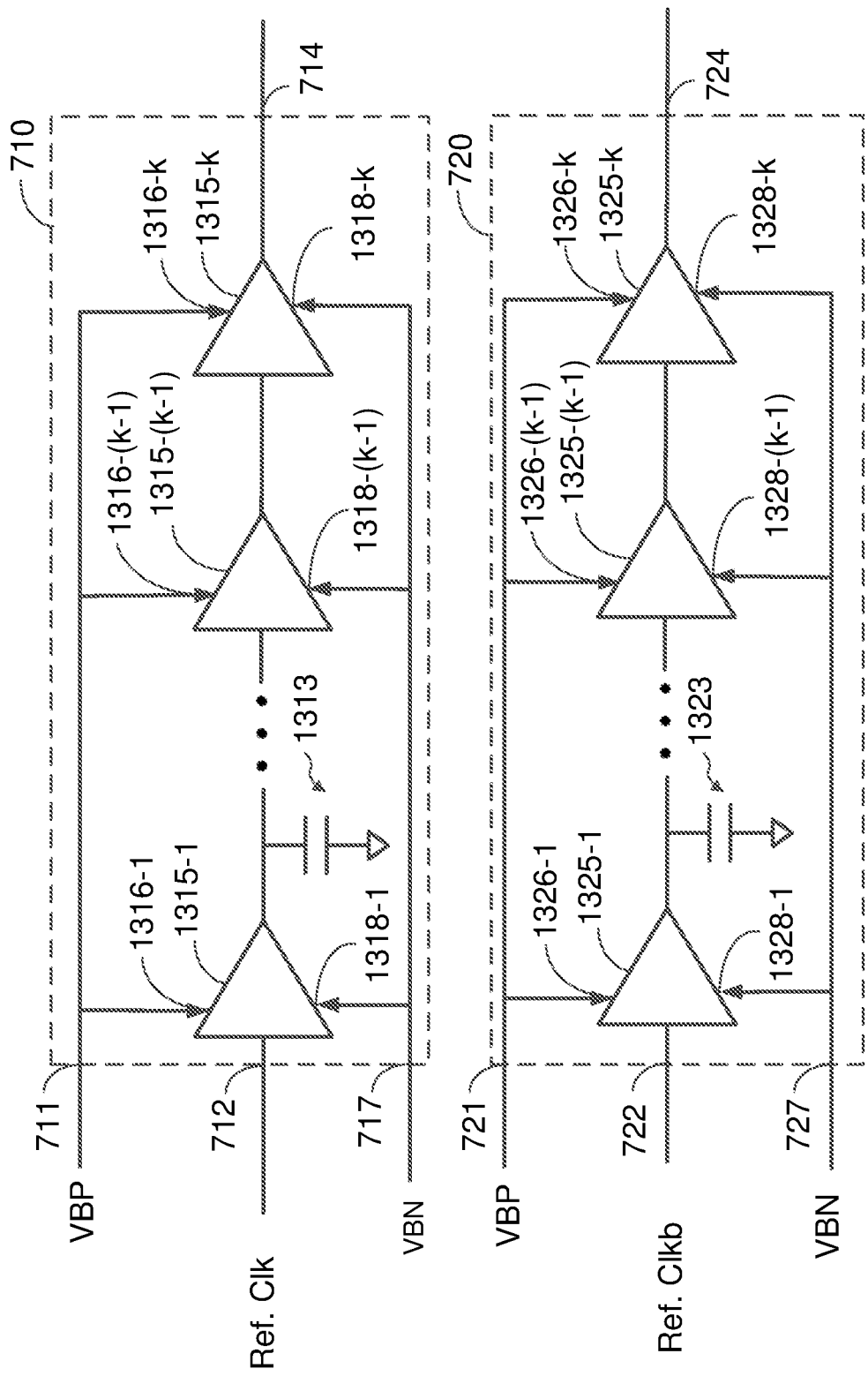
FIG. 13 shows an exemplary implementation of a first delay line and a second delay line according to certain aspects of the present disclosure.

FIG. 13 shows an example implementation of the first delay line 710 and the second delay line 720 according to certain aspects. In this example, the first delay line 710 includes first multiple delay elements 1315-1 to 1315-k coupled in series between the delay input 712 and the delay output 714 of the first delay line 710. Each of the delay elements 1315-1 to 1315-k may be implemented with the delay element 315 shown in FIG. 3 (i.e., each of the delay elements 1315-1 to 1315-k may be a separate instance of the delay element 315 in FIG. 3). In this example, the first bias input 711 is coupled to a first bias input 1316-1 to 1316-k of each of the delay elements 1315-1 to 1315-k. For the example in which each of the delay elements 1315-1 to 1315-k is implemented with the delay element 315 in FIG. 3, the first bias input 1316-1 to 1316-k of each of the delay elements 1315-1 to 1315-k is coupled to the gate of the respective third transistor 330 (shown in FIG. 3) of the delay element. The second bias input 717 is coupled to a second bias input 1318-1 to 1318-k of each of the delay elements 1315-1 to 1315-k. For the example in which each of the delay elements 1315-1 to 1315-k is implemented with the delay element 315 in FIG. 3, the second bias input 1318-1 to 1318-k of each of the delay elements 1315-1 to 1315-k is coupled to the gate of the respective fourth transistor 340 (shown in FIG. 3) of the delay element. The first delay line 710 may also include a capacitor 1313 coupled between the output of delay element 1315-1 and ground.

The second delay line 1320 includes second multiple delay elements 1325-1 to 1325-k coupled in series between the delay input 722 and the delay output 724 of the second delay line 720. Each of the delay elements 1325-1 to 1325-k may be implemented with the delay element 315 shown in FIG. 3 (i.e., each of the delay elements 1325-1 to 1325-k may be a separate instance of the delay element 315 in FIG. 3). In this example, the first bias input 721 is coupled to a first bias input 1326-1 to 1326-k of each of the delay elements 1325-1 to 1325-k. For the example in which each of the delay elements 1325-1 to 1325-k is implemented with the delay element 315 in FIG. 3, the first bias input 1326-1 to 1326-k of each of the delay elements 1325-1 to 1325-k is coupled to the gate of the respective third transistor 330 (shown in FIG. 3) of the delay element. The second bias input 727 is coupled to a second bias input 1328-1 to 1328-k of each of the delay elements 1325-1 to 1325-k. For the example in which each of the delay elements 1325-1 to 1325-k is implemented with the delay element 315 in FIG. 3, the second bias input 1328-1 to 1328-k of each of the delay elements 1325-1 to 1325-k is coupled to the gate of the respective fourth transistor 340 (shown in FIG. 3) of the delay element. The second delay line 720 may also include a capacitor 1323 coupled between the output of delay element 1325-1 and ground. In one example, the first bias inputs 711 and 721 of the first and second delay lines 710 and 720, respectively, may be coupled to the output 516 of the first bias generator 510, and the second bias inputs 717 and 727 of the first and second delay lines 710 and 720, respectively, may be coupled to the bias input 514 of the first bias generator 510.

Figure 14:
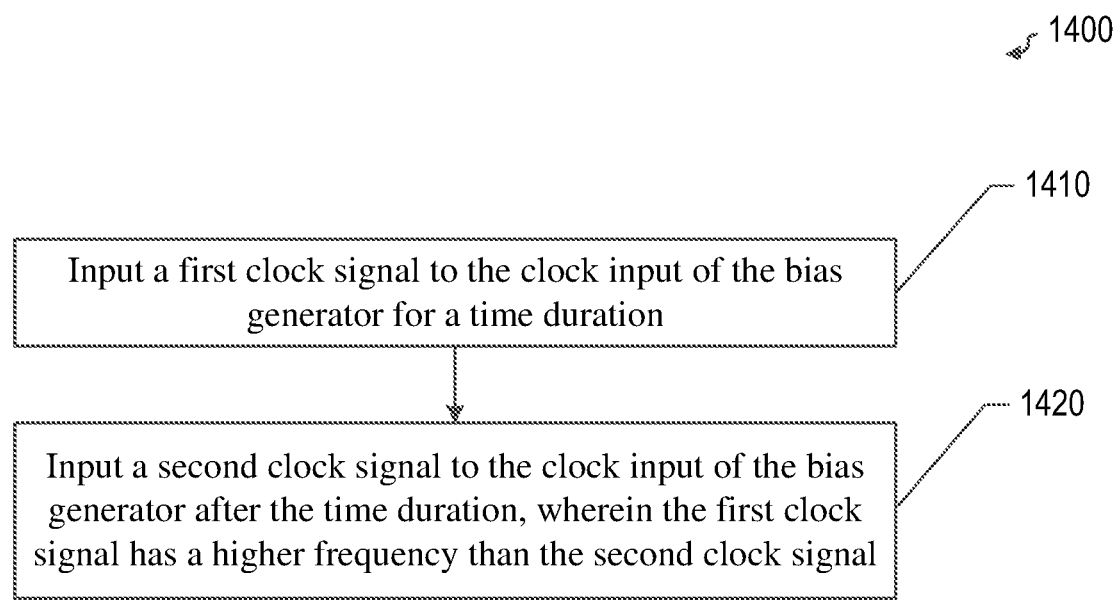
FIG. 14 is a flowchart illustrating a method for operating a delay circuit according to certain aspects of the present disclosure.

FIG. 14 is a flowchart illustrating a method 1400 for operating a delay circuit according to certain aspects of the present disclosure. The delay circuit includes a delay line (e.g., delay line 440) and a bias generator (e.g., the first bias generator 510) configured to bias the delay line. The bias generator includes a clock input (e.g., clock input 512).

At block 1410, a first clock signal is input to the clock input of the bias generator for a time duration. For example, the multiplexer 820 may input the first clock signal to the clock input of the bias generator to reduce the settling time of the bias voltage (e.g., the first bias voltage VBP) of the bias generator.

At block 1414, a second clock signal is input to the clock input of the bias generator after the time duration, wherein the first clock signal has a higher frequency than the second clock signal. For example, the multiplexer 820 may input the second clock signal to the clock input of the bias generator after the bias voltage of the bias generator has settled. In one example, the first clock signal has a frequency that is at least five times a frequency of the second clock signal.

The method 1400 may optionally include receiving a count value, and setting the time duration equal to a time duration approximately equal to a period of a third clock signal multiplied by the count value. For example, the counter 930 may set the time duration equal to the period of the third clock signal multiplied by the count value by initializing a count of the counter 930 to the count value, decrementing the count of the counter 930 for each period of the third clock signal, and instructing the multiplexer 820 to switch to the second clock signal when the count of the counter 930 reaches zero. In one example, the third clock signal may be the same as the second clock signal (e.g., the reference clock signal).

The method 1400 may optionally include generating the first clock signal using a clock generator (e.g., the clock generator 1020), enabling the clock generator during the time duration, and disabling the clock generator after the time duration. In one example, the counter 930 may enable and disable the clock generator.

In certain aspects, inputting the first clock signal to the clock input of the bias generator may include inputting the first logic state to the select input of the multiplexer, and inputting the second clock signal to the clock input of the bias generator may include inputting the second logic state to the select input of the multiplexer. In this example, the counter 930 may input the first logic state to the select input (e.g., select input 826) of the multiplexer (e.g., multiplexer 820) to input the first clock signal to the bias generator, and input the second logic state to the select input (e.g., select input 826) of the multiplexer (e.g., multiplexer 820) to input the second clock signal to the bias generator.

It is to be appreciated that the present disclosure is not limited to the exemplary terminology used above to describe aspects of the present disclosure. For example, a delay element may also be referred to as a delay cell, a buffer, or another term. In another example, a frequency divider may also be referred to as a clock divider, or another term.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A delay circuit, comprising:
    a delay line including a bias input;
    a bias generator including a clock input, and a bias output, wherein the bias output of the bias generator is coupled to the bias input of the delay line; and
    a multiplexer including a first input, a second input, a select input, and an output, wherein the first input of the multiplexer is configured to receive a first clock signal, the second input of the multiplexer is configured to receive a second clock signal, the select input of the multiplexer is configured to receive a select signal to select between the first clock input and the second clock to be output at the output of the multiplexer, and the output of the multiplexer is coupled to the clock input of the bias generator;
    wherein the first clock signal has a higher frequency than the second clock signal.

2. The delay circuit of claim 1, wherein the delay circuit further comprises:
    a counter including a clock input, a count value input, and an output, wherein the clock input of the counter is configured to receive a third clock signal, the count value input of the counter is configured to receive a count value, and the output of the counter provides the select signal and is coupled to the select input of the multiplexer.

3. The delay circuit of claim 2, wherein the first clock signal has a higher frequency than the second clock signal.

4. The delay circuit of claim 3, wherein the third clock signal is the same as the second clock signal.

5. The delay circuit of claim 2, wherein the counter is configured to:
    count a number of periods of the third clock signal; and
    change a logic state at the output of the counter when the number of periods of the third clock signal reaches the count value.

6. The delay circuit of claim 2, further comprising:
    a clock generator including an enable input and a clock output, wherein the enable input of the clock generator is coupled to the output of the counter, the clock output of the clock generator is coupled to the first input of the multiplexer, and the clock generator is configured to generate the first clock signal.

7. The delay circuit of claim 6, wherein the clock generator comprises:
    an oscillator including an enable input and an output, wherein the enable input of the oscillator is coupled to the enable input of the clock generator, and the output of the oscillator is coupled to the clock output of the clock generator.

8. The delay circuit of claim 6, wherein the clock generator comprises:
    an oscillator including an enable input and an output, wherein the enable input of the oscillator is coupled to the enable input of the clock generator; and
    a frequency divider including an input and an output, wherein the input of the frequency divider is coupled to the output of the oscillator, and the output of the frequency divider is coupled to the clock output of the clock generator.

9. The delay circuit of claim 1, wherein the delay line comprises:
    multiple delay elements coupled in series, wherein each of the multiple delay elements includes a respective bias input coupled to the bias input of the delay line.

10. The delay circuit of claim 9, wherein each of the delay elements comprises a respective current-starved delay element.

11. A delay circuit comprising:
    a delay line including a bias input;
    a bias generator including a clock input, and a bias output, wherein the bias output of the bias generator is coupled to the bias input of the delay line; and
    a multiplexer including a first input, a second input, and an output, wherein the first input of the multiplexer is configured to receive a first clock signal, the second input of the multiplexer is configured to receive a second clock signal, and the output of the multiplexer is coupled to the clock input of the bias generator;
    wherein the bias generator comprises:
        a first delay line including a delay input, a bias input, and a delay output, wherein the delay input of the first delay line is coupled to the clock input of the bias generator;
        a second delay line including a delay input, a bias input, and a delay output, wherein the delay input of the second delay line is coupled to the clock input of the bias generator via an inverter; and
        a driver circuit including a first input, a second input, and an output, wherein the first input of the driver circuit is coupled to the delay output of the first delay line, the second input of the charge circuit is coupled to the delay output of the second delay line, and the output of the driver circuit is coupled to the bias output of the bias generator, the bias input of the first delay line, and the bias input of the second delay line.

12. The delay circuit of claim 11, wherein the driver circuit comprises:
    a first driver including a first input, a second input, and an output, wherein the first input of the first driver is coupled to the first input of the driver circuit, the second input of the first driver is coupled to the second input of the driver circuit, and the output of the first driver is coupled to the output of the driver circuit; and
    a second driver including a first input, a second input, and an output, wherein the first input of the second driver is coupled to the first input of the driver circuit, the second input of the second driver is coupled to the second input of the driver circuit, and the output of the second driver is coupled to the output of the driver circuit.

13. The delay circuit of claim 11, wherein:
    the first delay line comprises first multiple delay elements coupled in series, wherein each of the first multiple delay elements includes a respective bias input coupled to the bias input of the first delay line; and the second delay line comprises second multiple delay elements coupled in series, wherein each of the second multiple delay elements includes a respective bias input coupled to the bias input of the second delay line.

14. A method for operating a delay circuit, wherein the delay circuit includes a delay line and a bias generator configured to bias the delay line, and the bias generator includes a clock input, the method comprising:
inputting a first clock signal to the clock input of the bias generator for a time duration based on a first logic state of a select signal; and
inputting a second clock signal to the clock input of the bias generator after the time duration based on a second logic state of the select signal, wherein the first clock signal has a higher frequency than the second clock signal.

15. The method of claim 14, wherein the first clock signal has a frequency that is at least five times a frequency of the second clock signal.

16. The method of claim 15, further comprising:
receiving a count value; and
setting the time duration equal to a time duration approximately equal to a period of a third clock signal multiplied by the count value.

17. The method of claim 16, wherein the third clock signal is the same as the second clock signal.

18. The method of claim 15, further comprising:
generating the first clock signal using a clock generator;
enabling the clock generator during the time duration; and
disabling the clock generator after the time duration.

19. The method of claim 15, wherein the delay circuit includes a multiplexer configured to receive the first clock signal and the second clock signal, to couple the first clock signal to the clock input of the bias generator if the first logic state of the select signal is input to a select input of the multiplexer, and to couple the second clock signal to the clock input of the bias generator if the second logic state of the select signal is input to the select input of the multiplexer, wherein:
inputting the first clock signal to the clock input of the bias generator comprises inputting the first logic state to the select input of the multiplexer; and
inputting the second clock signal to the clock input of the bias generator comprises inputting the second logic state to the select input of the multiplexer.

20. An apparatus for operating a delay circuit, wherein the delay circuit includes a delay line and a bias generator configured to bias the delay line, and the bias generator includes a clock input, the apparatus comprising:
means for inputting a first clock signal to the clock input of the bias generator for a time duration based on a first state of an input select signal from a means for supplying the input select signal; and
means for inputting a second clock signal to the clock input of the bias generator after the time duration based on a second state of the input select signal, wherein the first clock signal has a higher frequency than the second clock signal.

21. The apparatus of claim 20, wherein the first clock signal has a frequency that is at least five times a frequency of the second clock signal.

* * * * *